(12) United States Patent
Rozenblit et al.

(10) Patent No.: US 7,764,055 B2
(45) Date of Patent: Jul. 27, 2010

(54) POLAR TRANSMITTER HAVING A DYNAMICALLY CONTROLLED VOLTAGE REGULATOR AND METHOD FOR OPERATING SAME

(75) Inventors: Dmitriy Rozenblit, Irvine, CA (US); Tirdad Sowlati, Irvine, CA (US); Morten Damgaard, Laguna Hills, CA (US); Darioush Agahi, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 501 days.

(21) Appl. No.: 11/483,687

(22) Filed: Jul. 10, 2006

(65) Prior Publication Data

US 2008/0009248 A1 Jan. 10, 2008

(51) Int. Cl.
*G05F 1/00* (2006.01)
(52) U.S. Cl. .................. 323/282; 323/224; 323/266
(58) Field of Classification Search .......... 323/282, 323/224, 266, 269, 270, 271, 272; 455/114.2, 455/114.3, 127.1, 230, 140.1, 125, 341, 194.2, 455/253.3, 309, 311; 330/297
See application file for complete search history.

(56) References Cited

U.S. PATENT DOCUMENTS

| | | | |
|---|---|---|---|
| 4,829,554 A | 5/1989 | Barnes et al. | |
| 6,636,023 B1* | 10/2003 | Amin | 323/268 |
| 6,825,725 B1 | 11/2004 | Doherty et al. | |
| 6,975,494 B2 | 12/2005 | Tang et al. | |
| 7,173,491 B2* | 2/2007 | Bocock et al. | 330/285 |
| 2002/0030543 A1* | 3/2002 | French et al. | 330/297 |
| 2002/0175747 A1 | 11/2002 | Tang et al. | |
| 2005/0064830 A1* | 3/2005 | Grigore | 455/127.4 |
| 2006/0267562 A1* | 11/2006 | Szepesi | 323/224 |
| 2007/0291873 A1* | 12/2007 | Saito et al. | 375/298 |

* cited by examiner

*Primary Examiner*—Bao Q Vu
*Assistant Examiner*—Nguyen Tran

(57) ABSTRACT

A supply voltage controlled power amplifier includes a power amplifier, a closed power control loop configured to generate a power control signal, and a voltage regulator coupled to the power control loop, the voltage regulator including a first regulator stage, a second regulator stage, and a peak detector, wherein an output of the second regulator stage is applied as a feedback signal to the first regulator stage and wherein an output of the first regulator stage is decreased to a level consistent with an output of the power amplifier and an additional operating buffer amount.

21 Claims, 8 Drawing Sheets

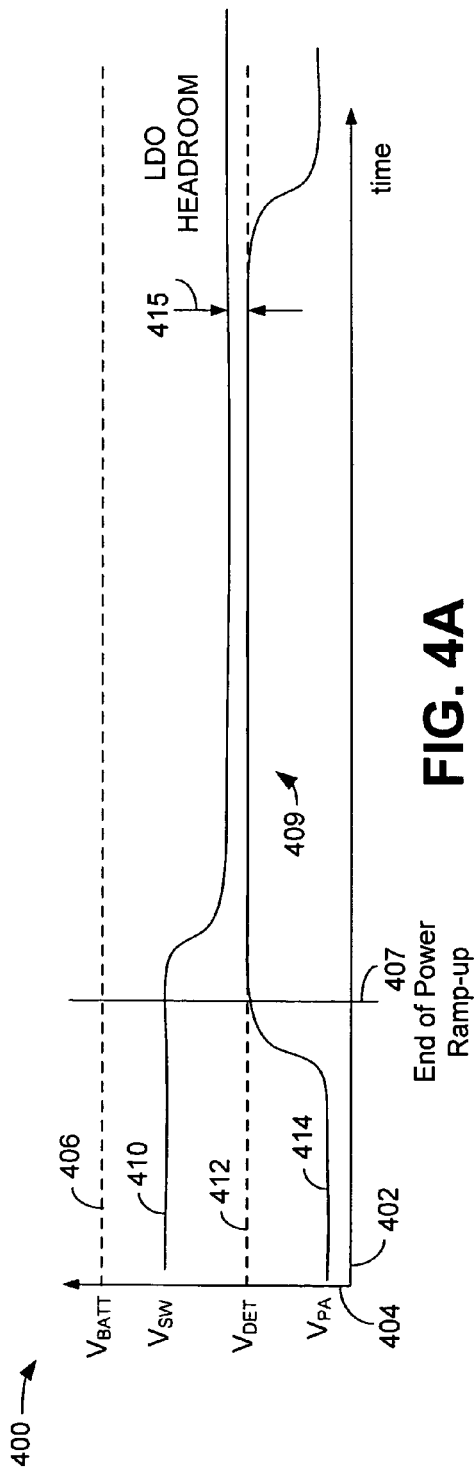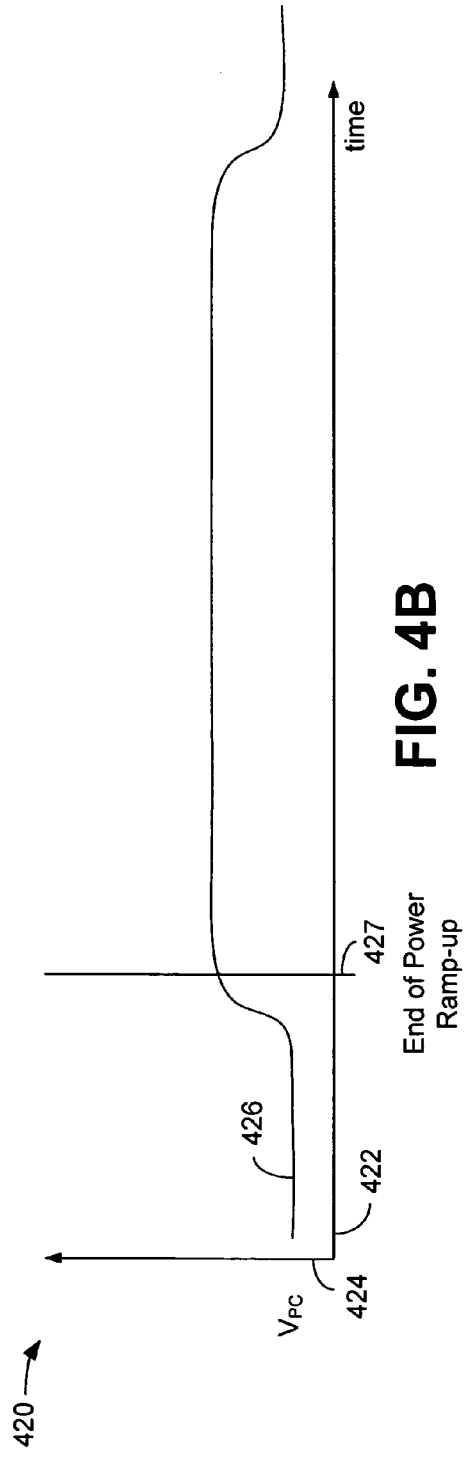

POLAR TRANSMITTER HAVING A DYNAMICALLY CONTROLLED VOLTAGE REGULATOR AND METHOD FOR OPERATING SAME

BACKGROUND

With the increasing availability of efficient, low cost electronic modules, portable communication devices are becoming more and more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device. In a portable communication device that uses a non-constant amplitude output (i.e., one that modulates and amplifies both a phase component and an amplitude component), a linear power amplifier is typically used. The efficiency of the power amplifier decreases rapidly as the transmission output power decreases from a maximum level. This results in a paradox. To reduce power consumption, the power output of the power amplifier is reduced when conditions permit. Unfortunately, power amplifier efficiency rapidly decreases as the power output is reduced, thus leading to increased power consumption, and reduced power source life.

One type of power amplifier is referred to as a "supply voltage controlled" power amplifier. This power amplifier methodology varies the power output of the power amplifier by controlling the supply voltage to the power amplifier. The output power of a supply voltage controlled power amplifier (PA) is determined by a regulated voltage applied to the collector terminal of a bi-polar junction transistor (or drain terminal, if implemented as a field effect transistor (FET)) of one or more stages of the power amplifier. If implemented using bi-polar technology, this power amplifier is also referred to as a collector voltage amplifier control (COVAC) power amplifier.

To improve the efficiency of a supply voltage controlled power amplifier operating at a low power output level, a switching voltage regulator can be implemented to provide the supply voltage to the power amplifier. Unfortunately, a switching voltage regulator can inject noise and spurious components onto the transmit signal. The control bandwidth of a switching voltage regulator must also be capable of operating over the bandwidth of the transmit signal.

Therefore, it would be desirable to control the voltage applied to a supply control port of a power amplifier to minimize noise, spurious signal generation and switching transients, thereby minimizing spectral regrowth and minimizing power consumption.

SUMMARY

Embodiments of the invention include a supply voltage controlled power amplifier comprising a power amplifier, a closed power control loop configured to generate a power control signal, and a voltage regulator coupled to the power control loop, the voltage regulator comprising a first regulator stage, a second regulator stage, and a peak detector, wherein an output of the second regulator stage is applied as a feedback signal to the first regulator stage and wherein an output of the first regulator stage is decreased to a level consistent with an output of the power amplifier and an additional operating buffer amount.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

FIGS. 4A through 4D are graphical illustrations of the supply control element of FIG. 3 under various operating conditions.

DETAILED DESCRIPTION

Figure 1:
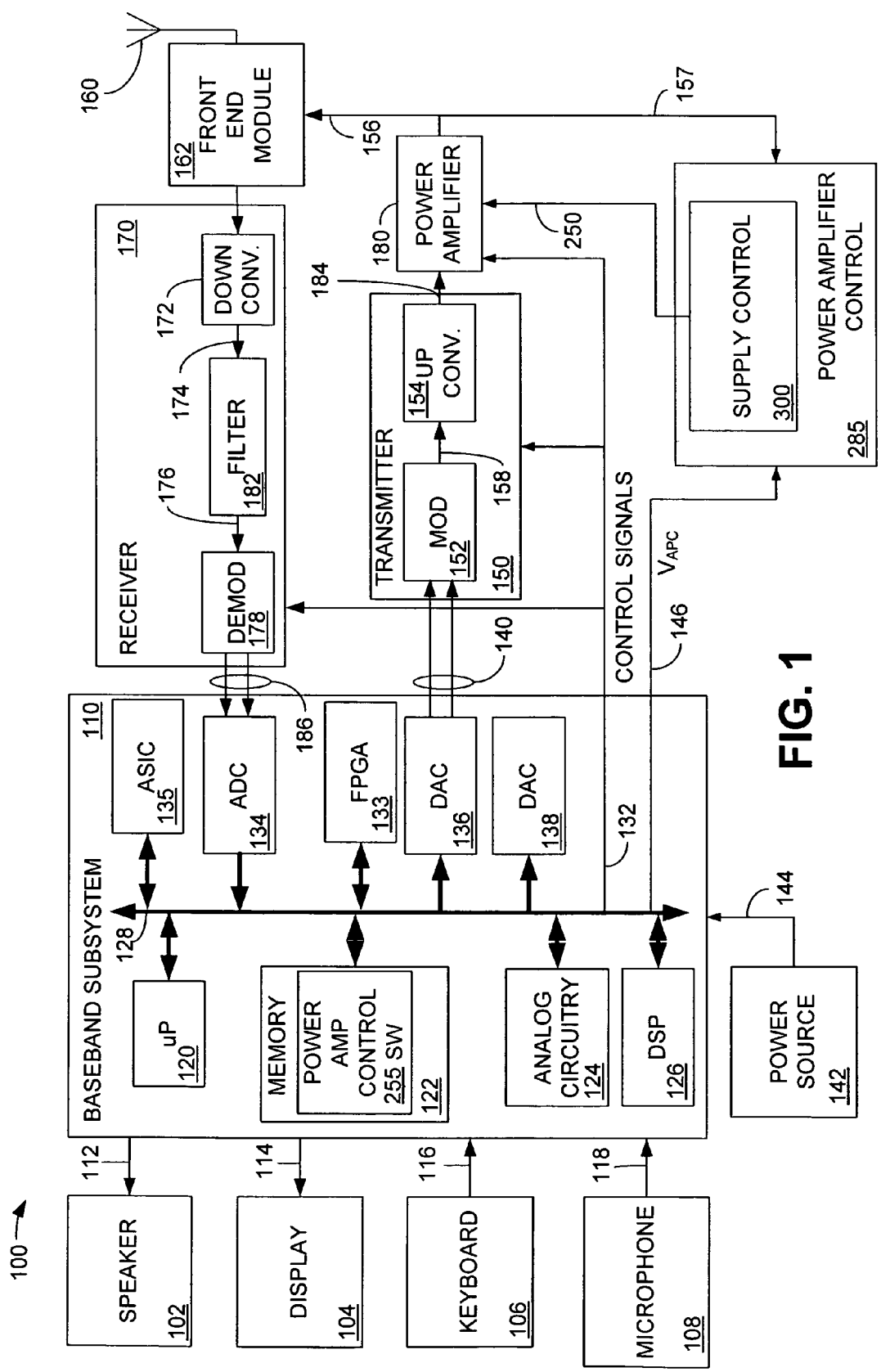
FIG. 1 is a block diagram illustrating a simplified portable transceiver including a power amplifier control element according to one embodiment of the invention.

Although described with particular reference to a portable transceiver, the power amplifier control element includes a dynamically controlled voltage regulator and can be implemented in any communication device employing a closed feedback power control loop and a supply voltage controlled power amplifier.

The power amplifier control element can be implemented in hardware, software, or a combination of hardware and software. When implemented in hardware, the power amplifier control element can be implemented using specialized hardware elements and logic. When the power amplifier control element is implemented partially in software, the software portion can be used to control components in the power amplifier control element so that various operating aspects can be software-controlled. The software can be stored in a memory and executed by a suitable instruction execution system (microprocessor). The hardware implementation of the power amplifier control element can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the power amplifier control element comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including an embodiment of a power amplifier control element having a supply control element. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the power amplifier control element is implemented, the baseband subsystem 110 may also include an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150, receiver 170 power amplifier 180 and the power amplifier control element 285 such as through connection 132 for example.

The baseband subsystem 110 generates a power control signal, referred to as $V_{APC}$ which is supplied to the power amplifier control element 285 via connection 146. The signal $V_{APC}$ is generated by the baseband subsystem 110 and is generally converted to an analog control signal by one of the digital-to-analog converters (DACs) 136 or 138 to be described below. The power control signal $V_{APC}$ is illustrated as being supplied from the bus 128 to indicate that the signal may be generated in different ways as known to those skilled in the art. Generally, the power control signal, $V_{APC}$, is generated in the baseband subsystem 110 and controls the power amplifier as a function of the peak voltage of the power amplifier determined during calibration, and corresponds to power amplifier output power.

The control signals on connections 132 and 146 may originate from the DSP 126, the ASIC 135, the FPGA 133, or from microprocessor 120, and are supplied to a variety of connections within the transmitter 150, receiver 170, power amplifier 180, and the power amplifier control element 285. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

If portions of the power amplifier control element 285 are implemented in software that is executed by the microprocessor 120, the memory 122 will also include power amplifier control software 255. The power amplifier control software 255 comprises one or more executable code segments that can be stored in the memory and executed in the microprocessor 120. Alternatively, the functionality of the power amplifier control software 255 can be coded into the ASIC 135 or can be executed by the FPGA 133, or another device. Because the memory 122 can be rewritable and because the FPGA 133 is reprogrammable, updates to the power amplifier control software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information on connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier 180 amplifies the signal to an appropriate power level for the system in which the portable transceiver 100 is designed to operate.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier module is used in a constant-amplitude, phase (or frequency) modulation application such as the global system for mobile communications (GSM), the phase modulated information is provided by the modulator 152. When the power amplifier module is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 152, while the amplitude modulation is performed by the power amplifier control element 285, where the amplitude envelope is defined by a power amplifier power control voltage $V_{PC}$, which is generated by the power amplifier control element 285. The instantaneous power level of the power amplifier module 180 tracks $V_{PC}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier 180 supplies the amplified signal via connection 156 to a front end module 162. The front end module comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 160.

Using the power amplifier power control voltage, $V_{PC}$, generated by the power amplifier control element 285, the power amplifier control element 285 determines the appropriate power level at which the power amplifier 180 operates to amplify the transmit signal. The power amplifier power control voltage, $V_{PC}$, is also used to provide envelope, or amplitude, modulation when required by the modulation standard. The power amplifier control element 285 also includes a supply control element 300 to be described below. The power amplifier control element 285 provides a regulated supply voltage (referred to as $V_{CC}$) to the power amplifier 180 via connection 250, which determines the output of the power amplifier by controlling the supply voltage delivered to the power amplifier 180. The power amplifier control element 285 and the supply control element 300 will be described in greater detail below.

A signal received by antenna 160 will be directed from the front end module 162 to the receiver 170. The receiver 170 includes a downconverter 172, a filter 182, and a demodulator 178. If implemented using a direct conversion receiver (DCR), the downconverter 172 converts the received signal from an RF level to a baseband level (DC). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
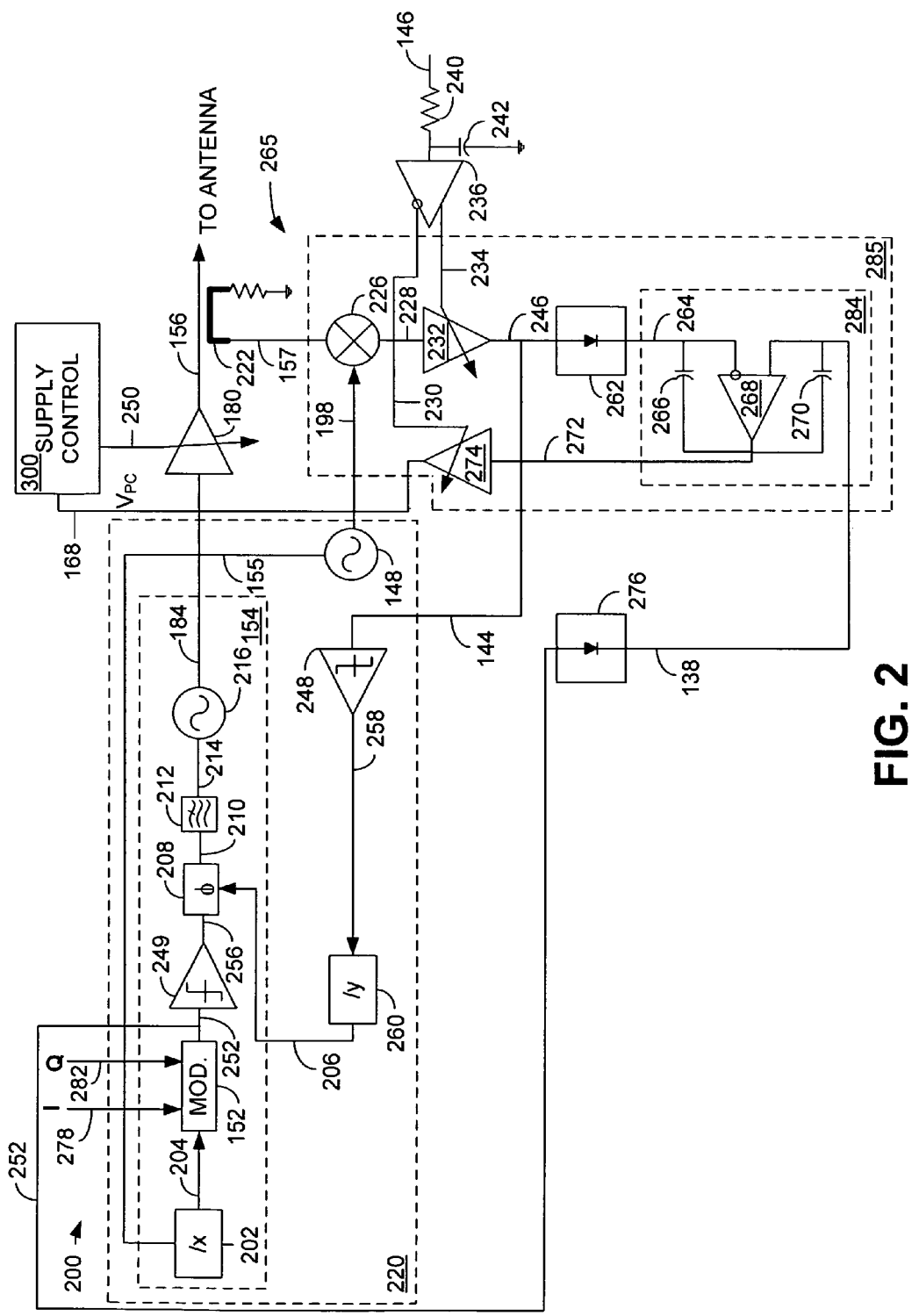
FIG. 2 is a block diagram illustrating the upconverter, power amplifier control element and the supply control element of FIG. 1.

FIG. 2 is a block diagram illustrating the upconverter 154, power amplifier control element 285 and the supply control element 300 of FIG. 1. Beginning with a description of the power amplifier control element 285, which forms a closed power control loop 265, or an "AM control loop," a portion of the output power present at the output of power amplifier 180 on connection 156 is diverted by coupler 222 via connection 157 and input to a mixer 226. The mixer 226 also receives a local oscillator (LO) signal from a synthesizer 148 via connection 198.

The mixer 226 downconverts the RF signal on connection 157 to an intermediate frequency (IF) signal on connection 228. For example, the mixer 226 takes a signal having a frequency of approximately 2 gigahertz (GHz) on connection 157 and down converts it to a frequency of approximately 100 megahertz (MHz) on connection 228 for input to variable gain element 232. The variable gain element 232 can be, for example but not limited to, a variable gain amplifier or an attenuator. In such an arrangement, the variable gain element 232 might have a dynamic range of approximately 70 decibels (dB) i.e., +35 dB/−35 dB. The variable gain element 232 receives a control signal input from the non-inverting output of an amplifier 236 via connection 234. The input to amplifier 236 is supplied via connection 146 from the baseband subsystem 10 of FIG. 1. The signal on connection 146 is the power control signal, $V_{APC}$ which is a reference voltage signal that defines the transmit power level and provides the power profile. This signal on connection 146 is supplied to a reconstruction filter, which includes resistor 240 and capacitor 242. In this manner, a reference voltage for the transmit power level and power profile is supplied via connection 234 to the control input of the variable gain element 232.

The output of the variable gain element 232 on connection 246 is an IF signal and includes modulation having both an AM component and a PM component and is called a "power measurement signal." This power measurement signal is related to the absolute output power of power amplifier 180, and includes a very small error related to the AM and PM components present in the signal. The output of variable gain element 232 on connection 246 is supplied to the input of power detector 262 and is also supplied to a limiter 248. The IF signal on connection 246 includes both an AM component and a PM component. The signal on connection 246 is supplied to a power detector 262, which provides, on connection 264, a baseband signal representing the instantaneous level of IF power present on connection 246. The output of the power detector 262 on connection 264 is supplied to the inverting input of amplifier 268.

The amplifier 268, the capacitor 266 and the capacitor 270 form a comparator 284, which provides the error signal used to control the power amplifier 180 via connection 272. The non-inverting input to the amplifier 268 is supplied via connection 138 from the output of the modulator 152 through the power detector 276. The signal on connection 138 is supplied to the non-inverting input of the amplifier 268 and contains the AM modulation developed by the modulator 152 for input to the control port 250 of the power amplifier 180.

The gain of the power amplifier control element 285 amplifies the signal on connection 272 such that the difference between the signals on connection 264 and on connection 138 input to amplifier 268 provide an error signal on connection 272 that is used to control the output of the power amplifier 180. The error signal on connection 272 is supplied to variable gain element 274, which can be similar in structure to the variable gain element 232. However, the variable gain element 274 has a function that is inverse to the function of the variable gain element 232. The control input to variable gain element 274 is supplied from the inverting output of amplifier 236. In this manner, the power amplifier control signal on connection 250 supplied to the control port of the power amplifier 180 drives the power amplifier 180 to provide the proper output on connection 156.

The level of the signal on connection 264 and the level of the signal on connection 138 should be equal. For example, if the output level of the variable gain element 232 is increased by a factor of 10, then the level of the output of power amplifier 180 should be decreased accordingly, to maintain equilibrium at the input of the amplifier 268. The output of the power amplifier 180 changes to cancel the gain change of variable gain element 232. In this manner, the amplitude of the signal on connection 264 remains equal to the amplitude of the signal on connection 138. However, this implies that the signal on connection 228 lags the signal on connection 234 with the result that the two signals will not completely cancel. In this manner, an error signal with an AM portion and a PM portion is present on connection 246. The signal on connection 246 is converted by power detector 262 from an IF signal to a baseband signal on connection 264. The signal on connection 264 is amplified by amplifier 268 and amplifier 274 and provided as the $V_{PC}$ input to the supply control element 300 on connection 168. The supply control element 300 controls the supply voltage to the power amplifier 180 via connection 250 so that the desired signal is achieved at the output of the power amplifier 180 on connection 156. The power amplifier control element 285 has sufficient gain so that the error signal on connection 264 can be kept small. In such a case, the gain changes of variable gain element 232 and the power amplifier 180 will substantially be the inverse of each other.

In addition to amplifying the error signal on connection 264, the amplifier 268 also compares the power measurement signal on connection 264 with a reference voltage signal including an AM portion on connection 138, supplied by the modulator 152. The DC voltage level on connection 138 affects the desired static output power for the power amplifier 268, irrespective of AM modulation. The amplifier 268 compares the signal level on connection 264 with the signal level on connection 138 and then amplifies the difference, thus providing a power control signal on connection 272. The comparator 284 functions as an integrator, which is also a low pass filter. Alternatively, the AM portion of the signal may be introduced to the power amplifier control element 285 in other ways, such as, for example, through the variable gain element 232.

The power control signal on connection 272 drives the variable gain amplifier 274, which corrects for the effect that the variable gain element 232 has on the transfer function of the power amplifier control element 285. The variable gains of the variable gain element 232 and variable gain element 274 are complimentary. Because the power measurement signal is present on connection 264 and the AM error signal is present on connection 138, the amplifier 268 provides a dual function; (1) it amplifies the AM error signal on connection 138 so as to modulate the power output of power amplifier 180 via connection 250 to have the correct amount of AM; and (2) it performs the average power comparison and amplifies the result, thus providing a control signal on connection 272 that drives the variable gain amplifier 274. The variable gain amplifier 274 provides the power amplifier power control voltage, $V_{PC}$, on connection 168, which includes the AM portion and which drives the supply control element 300 to control the supply voltage delivered to the power amplifier 180. The supply control element 285 drives the power amplifier 180 to the correct average power output. In this manner, power output is controlled and the desired AM portion of the signal is supplied to the control input 250 of power amplifier 180 and made present on the power amplifier output on connection 156. The mixer 226, variable gain element 232, power detector 262, amplifier 268 and the variable gain element 274 provide a continuous closed power control loop 265 to control the power output of power amplifier 180, while allowing for the introduction of the AM portion of the transmit signal via connection 138.

The closed power control loop 265 allows the correction of any phase shift caused by power amplifier 180. The phase locked loop 220 now includes a closed power control feedback loop for looping back the output of power amplifier 180 to the input of phase/frequency detector 208. Any unwanted phase shift generated by the power amplifier 180 will be corrected by the phase locked loop 220. The output of variable gain element 232 passes any phase distortion present via connection 246 to limiter 248 for correction by the phase locked loop 220. As such, the phase of the output of power amplifier 180 is forced to follow the phase of the LO signal on connection 155.

To remove the AM from the output of variable gain element 232, the variable gain element 232 is connected via connection 246 and connection 144 to the input of limiter 248. The limiter 248 develops a local oscillator signal containing only a PM component on connection 258. This LO signal is supplied via connection 258 to a divider 260, which divides the signal on connection 258 by a number, "y." The number "y," is chosen so as to minimize the design complexity of the synthesizer 148. The output of the divider 260 is supplied to the phase/frequency detector 208.

An unmodulated input signal from synthesizer 148 is supplied to the divider 202 via connection 155. The unmodulated input signal is frequency divided by a number "x" to provide a signal having an appropriate frequency on connection 204. The number "x" is chosen to minimize the design complexity of the synthesizer 148 and can be, for example, but not limited to, chosen to convert the output of the synthesizer 148 to a frequency of approximately 100 MHz. The output of the divider on connection 204 is supplied to the modulator 152. In addition, the baseband I and Q information signals are supplied via connections 278 and 282, respectively, to the modulator 152. The I and Q baseband information signal interface is understood by those having ordinary skill in the art. As a result of the operation of the modulator 152, the output on connection 252 is an intermediate frequency signal including an AM component in the form of an AM reference signal and a small PM error signal. The output of modulator 152 is supplied via connection 252 to power detector 276. The output of power detector 276 also includes the AM portion of the desired transmit signal. The signal provided on connection 138 is a reference signal for input to the power amplifier control element 285. Because the power amplifier control element 285 has limited bandwidth, the rate at which the amplitude modulation occurs on connection 138 is preferably within the bandwidth of the power control feedback loop 265.

The components within the phase locked loop 220 provide gain for the comparison of the PM on connection 258 and the modulator connections 278 and 282, thus providing a phase error output of the modulator 152 on connection 252. This phase error signal is then supplied to limiter 248, which outputs a signal on connection 258 containing the small PM phase error component.

The error signal output of modulator 152 on connection 252 containing the phase error, will get smaller and smaller as the gain of the phase locked loop 220 increases. However, there will always be some error signal present, thus enabling the phase locked loop 220 to achieve phase lock. It should be noted that even when the power amplifier 180 is not operating, there will always be some small leakage through the power amplifier 180 onto connection 156. This small leakage is sufficient to provide a feedback signal through the variable gain element 232 and into the phase locked loop 220 such that the phase locked loop 220 can be locked using just the leakage output of power amplifier 180. In this manner, a single feedback loop can be used to continuously control the output power of power amplifier 180 from the time that the amplifier is off through the time when the amplifier 180 is providing full output power.

The output of the modulator 152 is supplied via connection 252 to a limiter 249. The limiter 249 cancels the AM component present on connection 252, thereby preventing any AM-to-PM conversion in the phase/frequency detector 208. The phase/frequency detector 208 receives an unmodulated input signal from the limiter 249. The phase/frequency detector 208 also receives the output of divider 260 via connection 206. The phase/frequency detector 208 detects any phase difference between the signal on connection 256 and the signal on connection 206 and places a signal on connection 210 that has an amplitude proportional to the difference between the signals on connections 256 and 206. When the phase difference reaches 360°, the output of phase/frequency detector 208 on connection 210 will become proportional to the frequency difference between the signals on connections 256 and 206.

The output of phase/frequency detector 208 on connection 210 is a digital signal having a value of either a 0 or a 1 with a very small transition time between the two output states. This signal on connection 210 is supplied to low-pass filter 212, which integrates the signal on connection 210 and places a DC signal on connection 214 that controls the frequency of the transmit voltage control oscillator (TX VCO) 216. The output of TX VCO 216 is supplied via connection 184 directly to the power amplifier 180. In this manner, the synthesizer 148, limiter 248, modulator 152, limiter 256, divider 260, divider 202, phase/frequency detector 208, low-pass filter 212 and TX VCO 216 form a phase locked loop (PLL) 220, which is used to determine the transmit frequency on connection 184. Alternatively, the modulator 152 may reside outside of the PLL 220. When the PLL 220 is settled, or "locked," then the two signals entering the phase/frequency detector 208 on connections 256 and 206 have substantially the same phase and frequency, and the output of the phase/frequency detector 208 on connection 210 goes to zero. The output of the integrating low-pass filter 212 on connection 214 stabilizes, resulting in a fixed frequency out of TX VCO 216. For example, the synthesizer 148 and the mixer 226 ensure that the frequency of the signal output from the TX VCO 216 on connection 184 tracks the sum of the frequencies of the local oscillator signal supplied by synthesizer 148 and the IF frequency on connection 206.

When the phase locked loop 220 is locked, the phase of the signal on connection 256 and the phase of the signal on connection 206 will be substantially equal. Because the amount of PM on connection 206 should be very small, the gain in the phase locked loop 220 has to be sufficiently high to amplify the error signal on connection 206 to a level at which the phase/frequency detector 208 can make a comparison. By using the modulator 152 to impose the I and Q information signals on the signal on connection 204 in a direction opposite from which it is desirable for the phase of the TX VCO to move, and because it is desirable for the phase locked loop 220 to remain locked, the phase of the signal output from the TX VCO 216 on connection 184 will move opposite that of the phase imposed by the modulator 152. In this manner, the PM error signal present on connection 206 is minimized by the very high sensitivity, of the order of many MHz per volt, of the TX VCO 216.

Because the power amplifier control element 285 is a closed loop for AM signals at connection 138, it is possible to use a non-linear, and therefore highly efficient, power amplifier 180. Furthermore, the undesirable and detrimental AM-to-PM conversion, which occurs due to the amplitude dependence of an amplifier's phase shift, is rectified by the power amplifier 180 being included within the phase locked loop 220. By separating the AM and the PM modulation and by providing closed loop control for both the AM and PM modulation, a non-linear, and therefore highly efficient power amplifier can be used. The supply control element 300, which will be described in detail below, provides the AM portion of the signal and controls the output of the power amplifier 180 in such a way as to minimize low power inefficiency.

Figure 3:
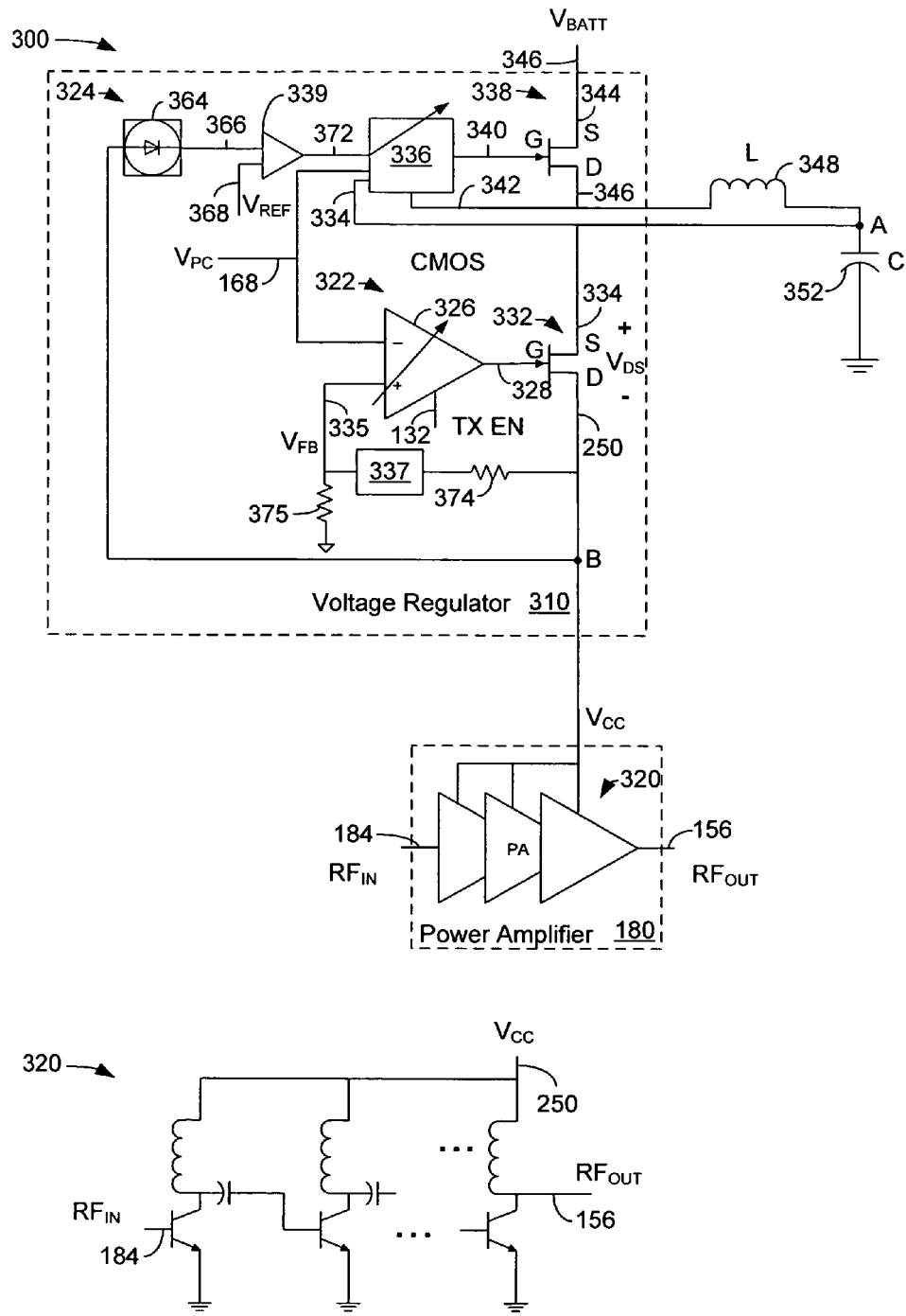
FIG. 3 is a block diagram illustrating an embodiment of the supply control element of FIG. 2.

FIG. 3 is a block diagram illustrating an embodiment of the supply control element 300 of FIG. 2. In this embodiment, the supply control element 300 is implemented as a voltage regulator 310. The voltage regulator 310 is located within the closed power control loop 265 created by the power amplifier control element 285. The power amplifier 180 comprises, in this example, multiple stages of power amplifier modules, indicated collectively at 320. In this example, the power amplifier stages are arranged in series. A radio frequency input signal ($RF_{IN}$) is supplied via connection 184 and the radio frequency output signal ($RF_{OUT}$) is supplied via connection 156. The signal on connection 156 is an amplified version of the signal on connection 184. In accordance with an embodiment of the invention, the level of the input signal on connection 184 is not proportionally related to the level of the output signal on connection 156. In this embodiment, the power amplifier 180 is controlled by a reference signal, referred to as $V_{CC}$ supplied from the voltage regulator 310 on connection 250.

The voltage regulator 310 comprises a linear voltage regulator 322 and a switching voltage regulator 324. In one embodiment, the linear voltage regulator 322 and the switching voltage regulator 324 may reside on the same die and may also reside on the same die or on a different die as the power amplifier 180. The power amplifier modules 320 within the power amplifier 180 are operated in a saturated mode, where the output power is not linearly related to the input power. When properly biased for saturated operation, the output power at connection 156 is related to the $V_{CC}$ signal on connection 250. In one embodiment, the power amplifier modules may be implemented as a series of bi-polar transistors in which the supply voltage control signal on connection is delivered to the collector terminal of each bi-polar amplifier module in the power amplifier 180. This is one possible implementation and is shown in FIG. 3 for example only.

The linear voltage regulator 322 includes an operational amplifier (op amp) 326, a p-type field effect transistor (PFET) 332, a resistor 374, a resistor 375 and a feedback connection 335. The feedback connection generally includes a transfer function, H, of the power amplifier power control voltage, $V_{PC}$. Since the power amplifier control element 285 (FIG. 2) is used to provide amplitude modulation, the bandwidth of the voltage regulator 310 is sufficient to support the envelope bandwidth of the modulated signal. The inverting input of the operational amplifier 326 is coupled to the power amplifier power control voltage, $V_{PC}$, generated by the power amplifier control element 285 (FIG. 2). Optionally, a level shifter (not shown) may be implemented between connection 168 and the input to the linear voltage regulator 322 to alter the level of the $V_{PC}$ signal supplied to the linear voltage regulator 322. The non-inverting input of the operational amplifier 326 receives the output ($V_{FB}$) of a feedback network 337 via connection 335. The output of the operational amplifier 326 is supplied via connection 328 to the gate terminal of the transistor 332. The source terminal 334 of the transistor 332 is coupled to a load filter capacitance 352. The drain terminal of the transistor 332 provides the output, $V_{CC}$, of the voltage regulator 310 on connection 250 to the collector terminal of the power amplifier 180. The output of the drain terminal 250 is also supplied as input to the feedback path 335.

The voltage regulator 310 includes a switching voltage regulator 324. The switching voltage regulator 324 includes a regulator component 336, a transistor 338, a peak detector 364 and a comparator 339. The peak detector 364 is configured in this embodiment to detect the peak voltage level on connection 250, which is also referred to as node "B." In this manner, the output of the linear voltage regulator 322 is also supplied as feedback to the switching voltage regulator 324. The output of the peak detector 364 is supplied via connection 366 to the comparator 339. The comparator 339 also receives a voltage reference signal, $V_{REF}$, on connection 368. As will be described below, the comparator 339 compares the output of the linear voltage regulator 322 on connection 250 with a reference voltage signal to determine whether there is an operating condition that requires maximum power output from the voltage regulator 310. If there is a condition, such as a change in the voltage standing wave ratio (VSWR), at the power amplifier that dictates maximum power output from the voltage regulator 310, then the switching voltage regulator 324 is placed in a bypass operating state that allows the linear voltage regulator 322 to supply maximum power output. The main condition that determines whether the switching voltage regulator 324 is placed in a bypass operating state is the level of the voltage at the output of the linear voltage regulator 322 above which the utilization of the switching voltage regulator 324 is no longer beneficial. For example, if the switching voltage regulator 324 has to operate at a very high output current beyond some point, it would require a much more expensive design and larger physical dimension thus minimizing the benefits described herein.

In this embodiment, the transistor 338 is shown as a p-type field effect transistor (PFET). The regulator component 336 receives the $V_{PC}$ signal via connection 168 and supplies an output to the gate terminal 340 of the transistor 338. The source terminal 344 of the transistor 338 is connected to battery voltage, $V_{BATT}$ on connection 346. The drain terminal 346 is coupled to a load filter inductance 348 and a load filter capacitance 352.

The source terminal 334 of the transistor 332 is also coupled to the load filter inductance 348 and to the load filter capacitance 352. The regulator component 336 of the switching voltage regulator 324 is also coupled between the load filter inductance 348 and the load filter capacitance 352, referred to as node "A," via connection 334. The switching voltage regulator 324 operates at a high efficiency to reduce the battery voltage from a value of, in this embodiment, approximately 4 volts (V) to a value of approximately 0.8V. The high and low voltage values could be different than stated here and are typically chosen by design. Then, the linear voltage regulator 322 reduces the output voltage of the switching voltage regulator 324 to the proper level that the closed power control loop 265 dictates. The switching voltage regulator 324 reduces the headroom on the linear voltage regulator 322. This is represented by the difference between the supply input on connection 344 and the output on connection 346 of the linear voltage regulator 322. The switching voltage regulator 324 maintains the average value of that headroom for a wide range of the output voltage of the linear voltage regulator 322, except the cases when the switching voltage regulator 324 goes into the by-pass mode. The minimum voltage of 0.8V is chosen because the linear voltage regulator 322 would not operate well in the particular circuit implementation if its supply voltage for the power (voltage) regulating transistor 332 drops below that value. The $V_{CC}$ signal on connection 250 is supplied to the supply terminal of one or more of the power amplifier modules 320. If the power amplifier 180 is implemented using bi-polar technology in a supply voltage controlled arrangement, the power amplifier 180 is referred to as a "collector voltage controlled" power supply.

However, the switching voltage regulator 324 is relatively difficult to implement in systems that have a high operating bandwidth requirement, such as the power amplifier control element 285 and the closed power control loop 265. The switching voltage regulator 324 has a control bandwidth of about 100 kilohertz (kHz), which is a reasonable bandwidth for a switching voltage regulator having a switching frequency of about 1.500 MHz. The linear voltage regulator 322 has a bandwidth of approximately 5 MHz to 10 MHz and the closed power control loop 265 has a bandwidth of approximately 1.8 Mhz. The control port (connection 168) of the switching voltage regulator 324 is connected directly to the power amplifier power control voltage, $V_{PC}$, via connection 168.

Figure 4C:
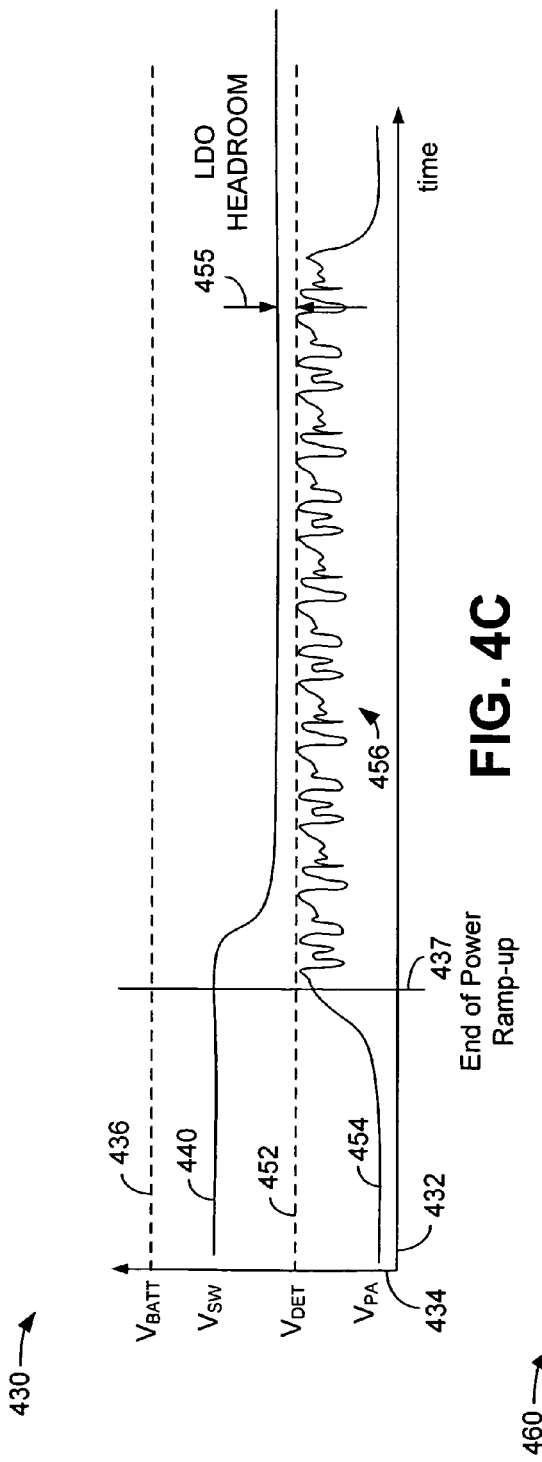

FIGS. 4A through 4D are graphical illustrations of the supply control element of FIG. 3 under various operating conditions. FIGS. 4A and 4B illustrate a normal constant envelope modulation operating condition in which VSWR is negligible. In FIG. 4A, the horizontal axis 402 represents time and the vertical axis 404 represents voltage. The curve 406 represents battery voltage, $V_{BATT}$, the curve 410 illustrates the voltage output, $V_{SW}$, of the switching voltage regulator 324 (FIG. 3), the curve 412 represents the output, $V_{DET}$, of the peak detector 364 (FIG. 3) and the curve 414 illustrates the output, $V_{PA}$, of the power amplifier, which also represents the power output of the linear voltage regulator 322 (FIG. 3). The line 407 represents the point in the transmit burst at which power ramp-up is complete and the burst is transmitting. In an embodiment, the voltage output, $V_{SW}$, 410 of the switching voltage regulator 324 (FIG. 3) could be equal to the battery voltage, $V_{BATT}$, 406.

Once the power output 414 of the power amplifier 180 (FIG. 3) ramps up and begins a steady state period 409, and after a predetermined delay the power output of the switching voltage regulator 324 (curve 410) is ramped down to a level that allows a predetermined amount of offset above the level of the output of the linear voltage regulator 322 (FIG. 3), which is illustrated as the power output, $V_{PA}$, of the power amplifier and illustrated using curve 414. In an embodiment, the predetermined delay is 25 microseconds (µs), but other delay durations are possible. In the region 409, the voltage level of the peak detector 364 (FIG. 3), shown using curve 412, is nearly identical to the level of $V_{PA}$. In this example, the operating buffer between the output of the switching voltage regulator 324 shown using curve 410 and the level of the output of the linear voltage regulator, shown using curve 414, is approximately 400 millivolts (mV) and is illustrated using reference numeral 415. The operating buffer is sometimes referred to as the "headroom." In this example, and the examples to follow, the difference between the output of the switching voltage regulator ($V_{SW}$) and the battery voltage ($V_{BATT}$) represents the benefit of reduced power consumption when the switching voltage regulator 324 is implemented.

FIG. 4B illustrates the relationship between the power amplifier power control voltage, $V_{PC}$, and the output, $V_{PA}$, of the power amplifier 180 (FIG. 3). In FIG. 4B, the horizontal axis 422 represents time and the vertical axis 424 represents voltage. The curve 426 represents the power amplifier power control voltage, $V_{PC}$. The line 427 represents the point in the transmit burst at which power ramp-up is complete and the burst is transmitting. As shown when comparing FIG. 4A and FIG. 4B, the output, $V_{PA}$, closely follows the profile of the power amplifier power control voltage, $V_{PC}$.

With reference to FIGS. 3, 4A and 4B, when the voltage at node A stabilizes at a particular level, the voltage at node B will settle to a level that is proportional to the level of the power amplifier power control voltage, $V_{PC}$. The peak detector 364 (FIG. 3) determines to level of the signal at node B causing the switching voltage regulator 324 to settle to the level of the voltage at node B plus an amount to provide a cushion for the linear voltage regulator 322. This is the headroom voltage between $V_{PA}$ and $V_{SW}$ in FIG. 4A. In an embodiment, the amount of voltage between $V_{PA}$ and $V_{SW}$ is 400 mV. However, depending on the application, other amounts will be appropriate.

FIG. 4C illustrates a normal non-constant (varying) envelope modulation operating condition in which VSWR is negligible. In FIG. 4C, the horizontal axis 432 represents time and the vertical axis 434 represents voltage. The curve 436 represents battery voltage, $V_{BATT}$, the curve 440 illustrates the voltage output, $V_{SW}$, of the switching voltage regulator 324 (FIG. 3), the curve 452 represents the output, $V_{DET}$, of the peak detector 364 (FIG. 3) and the curve 454 illustrates the output, $V_{PA}$, of the power amplifier, which also represents the power output of the linear voltage regulator 322 (FIG. 3). In this example, after power ramp-up, the output of the power amplifier 180 enters a non-constant envelope modulation period 456 during which the power output is continually varied throughout the duration of the transmit burst. The line 437 represents the point in the transmit burst at which power ramp-up is complete and the burst is transmitting.

Once the power output 454 of the power amplifier 180 (FIG. 3) ramps up and begins a non-constant envelope modulation period 456, the power output of the switching voltage regulator 324 (curve 440) is ramped down to a level that allows a predetermined amount of operating buffer above the max peak output of the linear voltage regulator 322 (FIG. 3), which is illustrated as the power output, $V_{PA}$, of the power amplifier and illustrated using curve 454. In this embodiment, the peak detector 364 (FIG. 3) measures the peak voltage of the output, $V_{PA}$, of the power amplifier 180 during the period 456. In the region 456, the voltage level of the peak detector 364 (FIG. 3), shown using curve 452, is similar to that shown in FIG. 4A with respect to the peak-average power of the $V_{PA}$ signal. In this example, the operating buffer between the output of the switching voltage regulator 324 shown using curve 440 and the level of the output of the linear voltage regulator, shown using curve 454, is approximately 400 millivolts (mV) plus some voltage associated with the peaks of the modulation envelope and is illustrated using reference numeral 455.

Figure 4D:
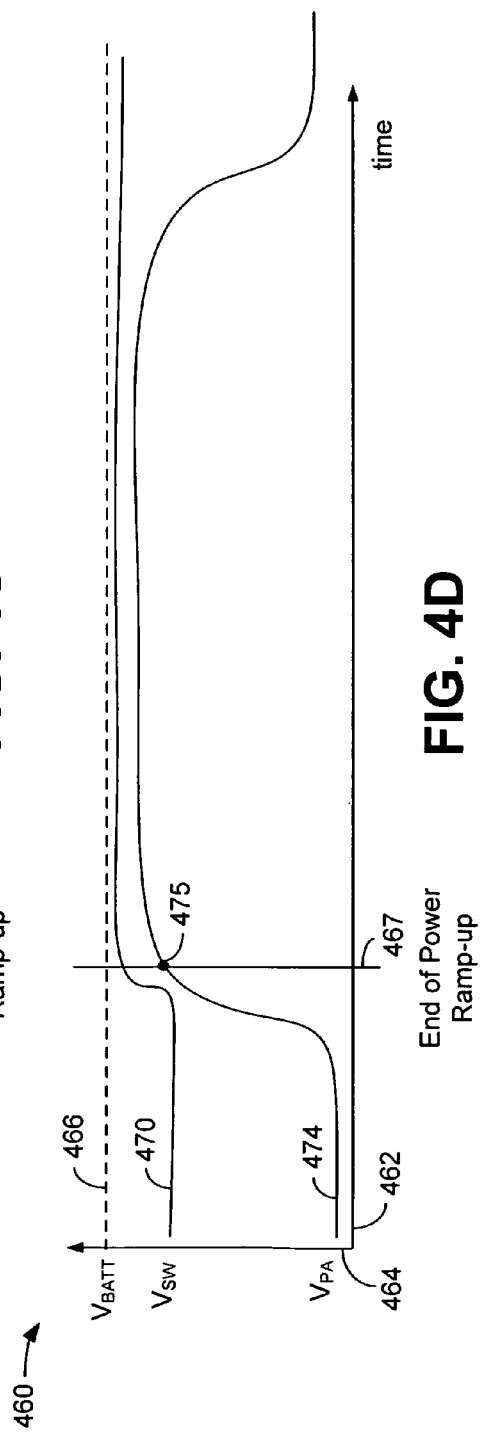

FIG. 4D illustrates a constant envelope modulation operating condition in which VSWR is present and causes the power amplifier to deliver maximum power. In FIG. 4D, the horizontal axis 462 represents time and the vertical axis 464 represents voltage. The curve 466 represents battery voltage, $V_{BATT}$, the curve 470 illustrates the voltage output, $V_{SW}$, of the switching voltage regulator 324 (FIG. 3) and the curve 474 illustrates the output, $V_{PA}$, of the power amplifier, which also represents the power output of the linear voltage regulator 322 (FIG. 3). The line 467 represents the point in the transmit burst at which power ramp-up is complete and the burst is transmitting.

In this example, after power ramp-up, the output of the power amplifier 180 continues to rise, signifying an event, such as VSWR at the power amplifier output that requires maximum power output from the power amplifier. This is illustrated in FIG. 4C at point 475. If the amount of operating buffer between the power output $V_{PA}$, of the power amplifier and the output $V_{SW}$, of the switching regulator exceeds a predetermined amount, then the switching voltage regulator 324 is caused to enter a bypass mode to allow the linear voltage regulator to supply maximum power. In this example, the output of the peak detector 364 (FIG. 3) is compared with a reference voltage level, $V_{REF}$, in the comparator 339. There are two cases when the bypass mode is enabled. The first is when the output voltage at the output of the linear voltage regulator 322 (FIG. 3) is being set by the power control loop (285, FIG. 2) to a value higher than a predetermined threshold (high transmit output power). The second case is when the headroom on the linear voltage regulator 322 (the difference between the output of the switching voltage regulator 324 and the output of the linear voltage regulator 322) drops below a certain predetermined level, below which the performance of the linear voltage regulator 322 would be compromised.

Figure 5:
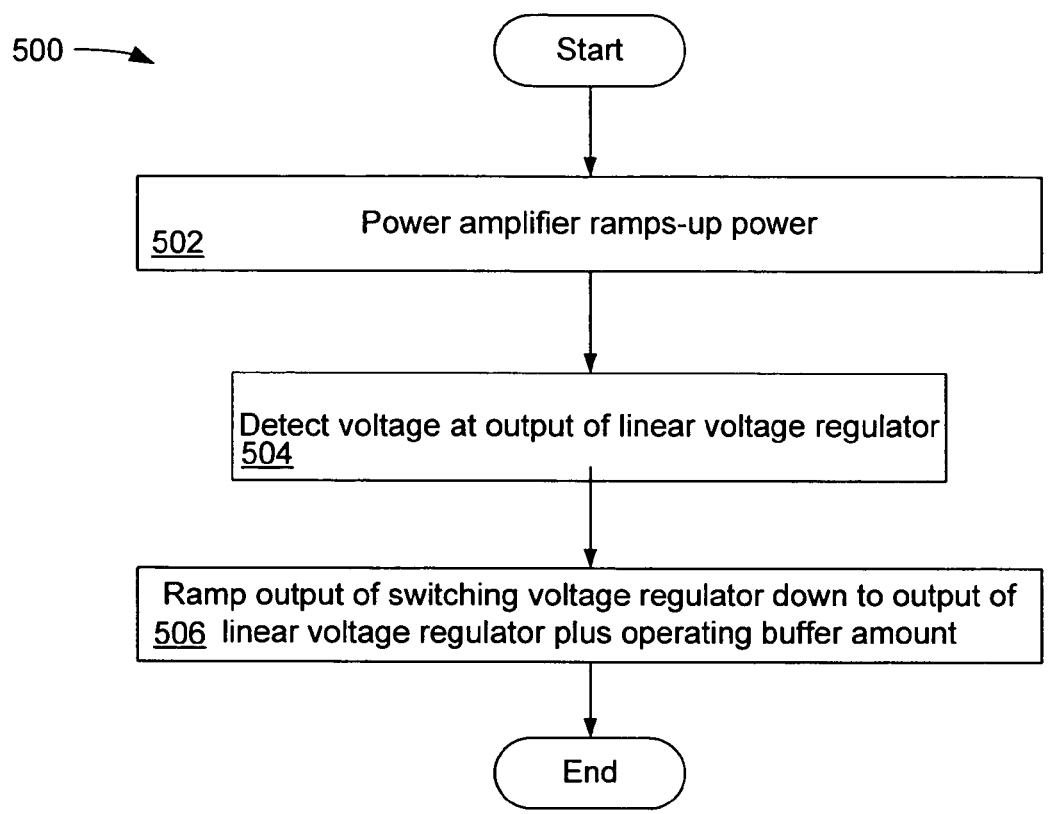
FIG. 5 is a flow chart illustrating the operation of an embodiment of the power amplifier control element.

FIG. 5 is a flow chart 500 illustrating the operation of an embodiment of the power amplifier control element. The blocks in the flowchart can be performed in the order shown, out of the order shown, or can be performed in parallel. In block 502, the power output of the power amplifier is ramped-up to a constant envelope amplitude modulation level. This is illustrated as curve 414 in FIG. 4A, which describes the power output, $V_{PA}$, of the power amplifier 180. In block 504, the peak detector 364 (FIG. 3) determines the level of the output of the linear voltage regulator 322 at node B causing the switching voltage regulator 324 to settle to the level of the voltage at node B plus an amount sufficient to provide an operating buffer for the linear voltage regulator 322. In block 506, the output of the switching voltage regulator 324 is ramped down to the level of the output of the linear voltage regulator 322 (curve 414 in FIG. 4A) plus the operating buffer amount (headroom voltage).

Figure 6:
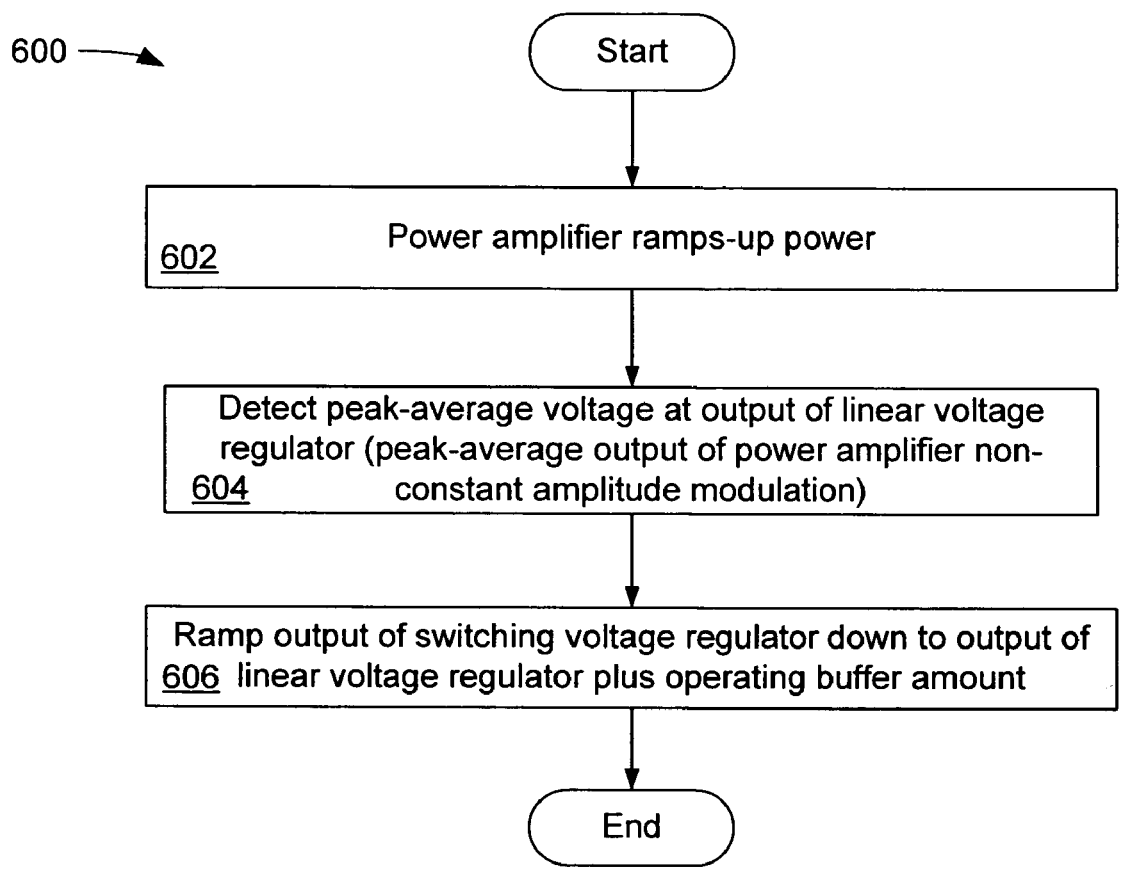
FIG. 6 is a flow chart illustrating the operation of an alternative embodiment of the power amplifier control element.

FIG. 6 is a flow chart 600 illustrating the operation of an alternative embodiment of the power amplifier control element. The flowchart of FIG. 6 illustrates the operation of the voltage regulator described in FIG. 4C. The blocks in the flowchart can be performed in the order shown, out of the order shown, or can be performed in parallel. In block 602, the power output of the power amplifier is ramped-up to a non-constant envelope amplitude modulation level. This is illustrated as curve 454 in FIG. 4C, which describes the power output, $V_{PA}$, of the power amplifier 180. In block 604, the peak detector 364 (FIG. 3) determines the peak-average maximum of the level of the signal at node B causing the switching voltage regulator 324 to settle to the level of the peak voltage at node B plus an amount sufficient to provide an operating buffer for the linear voltage regulator 322. In block 606, the output of the switching voltage regulator 324 is ramped down to the level of the peak output of the linear voltage regulator 322 (curve 454 in FIG. 4C) plus the operating buffer voltage.

Figure 7:
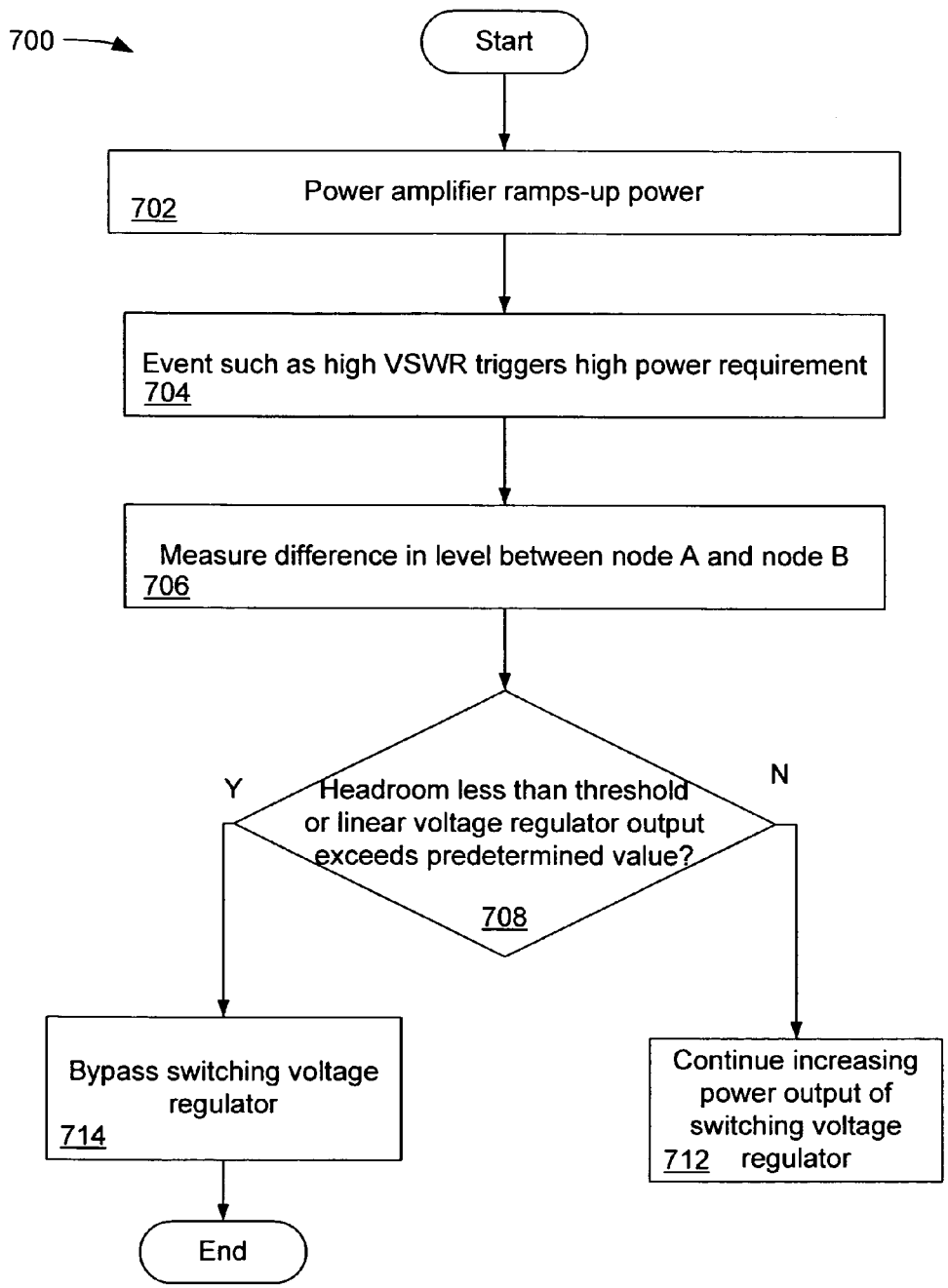
FIG. 7 is a flow chart illustrating the operation of another alternative embodiment of the power amplifier control element.

FIG. 7 is a flow chart 700 illustrating the operation of another alternative embodiment of the power amplifier control element. The blocks in the flowchart can be performed in the order shown, out of the order shown, or can be performed in parallel. In block 702, the power output of the power amplifier is ramped-up to a constant envelope amplitude modulation level. This is illustrated as curve 474 in FIG. 4D, which describes the power output, $V_{PA}$, of the power amplifier 180. In block 704, the power output level continues to rise signifying an event, such as VSWR at the power amplifier output that requires maximum power output from the power amplifier.

In block 706, the peak detector 364 (FIG. 3) determines the level of the signal at node B causing the switching voltage regulator 324 to settle to the level of the voltage at node B plus an amount sufficient to provide an operating buffer for the linear voltage regulator 322. In block 708, it is determined whether the operating buffer is less than the threshold amount or whether the output of the linear voltage regulator 322 (FIG. 3), at point B (connection 250 in FIG. 3), exceeds the predetermined maximum amount. In an embodiment, the operating buffer is 400 mV and the threshold is 250 mV. In an embodiment, the predetermined maximum amount is approximately 2 volts (V). Therefore, if the output of the power amplifier enters more than 250 mV into the operating buffer, or if the output of the linear voltage regulator 322 (FIG. 3), exceeds the predetermined maximum amount, then the threshold is exceeded. If it is determined in block 708 that the threshold is not exceeded, then, in block 712, the switching voltage regulator 324 continues to increase power. If it is determined in block 708 that the threshold is exceeded, then, in block 714, the switching voltage regulator 324 is bypassed to allow the linear voltage regulator to supply maximum power.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for dynamically controlling the power output of a power amplifier, comprising:
    providing a radio frequency (RF) signal to a power amplifier;
    generating a power control signal in a closed power control loop;
    providing the power control signal to a switching voltage regulator;
    providing the power control signal to a linear voltage regulator;
    providing a peak detector located between a control input of the switching voltage regulator and an output of the linear voltage regulator; and
    providing the output of the linear voltage regulator as a feedback signal through the peak detector to the control input of the switching voltage regulator, wherein an output of the switching voltage regulator is decreased to a level consistent with an output of the power amplifier and an additional operating buffer amount, the level determined in response to the peak detector.

2. The method of claim 1, further comprising using the feedback signal to dynamically control the switching voltage regulator.

3. The method of claim 2, further comprising using the feedback signal to dynamically control the linear voltage regulator.

4. The method of claim 1, wherein after a power ramp-up period, the output of the switching voltage regulator only ramps down.

5. The method of claim 1, further comprising locating the switching voltage regulator and the linear voltage regulator in the closed power control loop.

6. The method of claim 4, further comprising:
    comparing an output of the linear voltage regulator with a predetermined threshold to determine whether the output of the linear voltage regulator exceeds the predetermined threshold; and
    if the output of the linear voltage regulator exceeds the predetermined threshold bypassing the switching voltage regulator.

7. A supply voltage controlled power amplifier, comprising:
    a power amplifier;
    a closed power control loop configured to generate a power control signal; and
    a voltage regulator coupled to the power control loop, the voltage regulator comprising a first regulator stage, a second regulator stage, and a peak detector located between a control input of the first regulator stage and an output of the second regulator stage, the first regulator stage comprising a switching voltage regulator, the second regulator stage comprising a linear voltage regulator, wherein an output of the second regulator stage is applied as a feedback signal through the peak detector to the control input of the first regulator stage and wherein an output of the first regulator stage is decreased to a level consistent with an output of the power amplifier and an additional operating buffer amount, the level determined in response to the peak detector.

8. The supply voltage controlled power amplifier of claim 7, wherein the first regulator stage has a bandwidth narrower than a bandwidth of the second regulator stage.

9. The supply voltage controlled power amplifier of claim 8, wherein the second regulator stage has a bandwidth wider than a bandwidth of the first regulator stage.

10. The supply voltage controlled power amplifier of claim 8, wherein the feedback signal dynamically controls the switching voltage regulator.

11. The supply voltage controlled power amplifier of claim 9, wherein the feedback signal dynamically controls the linear voltage regulator.

12. The supply voltage controlled power amplifier of claim 7, wherein after a power ramp-up period, the output of the switching voltage regulator only ramps down.

13. The supply voltage controlled power amplifier of claim 7, wherein the first regulator stage and the second regulator stage are located in the closed power control loop.

14. The supply voltage controlled power amplifier of claim 12, further comprising:
    a comparator for comparing an output of the second voltage regulator with a predetermined threshold to determine whether the output of the second voltage regulator exceeds the predetermined threshold; and
    a bypass circuit for bypassing the first regulator stage if the output of the second voltage regulator exceeds the predetermined threshold.

15. A portable transceiver, comprising:
    a transceiver for transmitting and receiving a radio frequency (RF) signal;
    a power amplifier;
    a closed power control loop configured to generate a power control signal; and
    a voltage regulator coupled to the power control loop, the voltage regulator comprising a first regulator stage, a second regulator stage, and a peak detector located between a control input of the first regulator stage and an output of the second regulator stage, the first regulator stage comprising a switching voltage regulator, the second regulator stage comprising a linear voltage regulator, wherein the output of the second regulator stage is applied as a feedback signal through the peak detector to the control input of the first regulator stage and wherein an output of the first regulator stage is decreased to a level consistent with an output of the power amplifier and an additional operating buffer amount, the level determined in response to the peak detector.

16. The portable transceiver of claim 15, wherein the first regulator stage has a bandwidth narrower than a bandwidth of the second regulator stage.

17. The portable transceiver of claim 15, wherein the second regulator stage has a bandwidth wider than a bandwidth of the first regulator stage.

18. The portable transceiver of claim 16, wherein the feedback signal dynamically controls the switching voltage regulator.

19. The portable transceiver of claim 15, wherein after a power ramp-up period, the output of the switching voltage regulator only ramps down.

20. The portable transceiver of claim 19, wherein the first regulator stage and the second regulator stage are located in the closed power control loop.

21. The portable transceiver of claim 19, further comprising:
 a comparator for comparing an output of the linear voltage regulator with a predetermined threshold to determine whether the output of the linear voltage regulator exceeds the predetermined threshold; and
 a bypass circuit for bypassing the first regulator stage if the output of the linear voltage regulator exceeds the predetermined threshold.

* * * * *